United States Patent
Madeley

(10) Patent No.: US 6,637,329 B1
(45) Date of Patent: Oct. 28, 2003

(54) METHOD FOR IMPROVING REGISTRATION OF IMAGES ON OPPOSING SIDES OF A PRINTING MEDIUM

(75) Inventor: James Madeley, Vancouver (CA)

(73) Assignee: Creo Products Inc., Burnaby (CA)

( * ) Notice: Subject to any disclaimer, the term of this patent is extended or adjusted under 35 U.S.C. 154(b) by 260 days.

(21) Appl. No.: 09/710,125

(22) Filed: May 15, 2001

(51) Int. Cl.[7] .................................................. B41F 1/20
(52) U.S. Cl. ...................... 101/296; 101/129; 101/463.1
(58) Field of Search .................. 101/129, 287–290, 101/296, 463.1; 355/18, 26, 47; 347/248–250

(56) References Cited

U.S. PATENT DOCUMENTS

| | | | |
|---|---|---|---|
| 4,441,791 A | 4/1984 | Hornbeck | 350/360 |
| 4,577,932 A | 3/1986 | Gelbart | 350/358 |
| 4,591,880 A | 5/1986 | Mitsuka | 346/108 |
| 4,743,091 A | 5/1988 | Gelbart | 350/252 |
| 4,745,487 A | 5/1988 | Nishikawa | 358/289 |
| 4,801,950 A | 1/1989 | Frehling | 346/108 |
| 4,819,018 A | 4/1989 | Moyroud | 354/5 |
| 5,049,901 A | 9/1991 | Gelbart | 346/108 |
| 5,132,723 A | 7/1992 | Gelbart | 355/40 |
| 5,163,368 A | 11/1992 | Pensevecchia | 101/136 |
| 5,174,205 A | 12/1992 | Kline | 101/136 |
| 6,252,241 B1 * | 6/2001 | Sarussi | 250/559.4 |

* cited by examiner

Primary Examiner—Andrew H. Hirshfeld
Assistant Examiner—Minh Chau
(74) Attorney, Agent, or Firm—Oyen Wiggs Green & Mutala

(57) ABSTRACT

The present invention is a method to generate alignable orthogonal images from non-orthogonal scans in a double-sided digital-offset-press arrangement by shifting the image data in the multi-channel modulators in a direction and rate that keeps the images orthogonal. The image data is shifted parallel to the cylinder axes and the amount of shift per cylinder rotation equals the distance the multi-channel modulators move relative to their respective cylinders per rotation of the relevant cylinder. This prevents "parallelogram" type distortion in the images and maintains the orthogonality of the original images, thereby allowing the images on the opposing sides of the printing medium to be aligned. The shift can be done continuously or in discrete steps. The invention is also extendable to two-dimensional modulators such as deformable mirror devices (DMD) and liquid crystal light valves (LCLV).

10 Claims, 6 Drawing Sheets

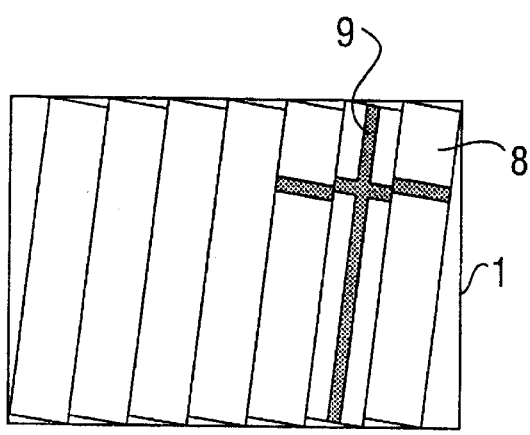
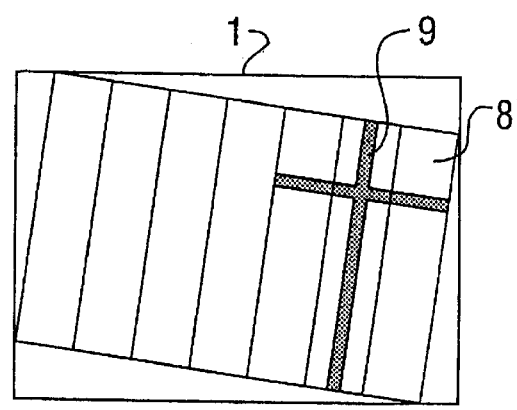
FIG. 2a
PRIOR ART
FIG. 2b
PRIOR ART

METHOD FOR IMPROVING REGISTRATION OF IMAGES ON OPPOSING SIDES OF A PRINTING MEDIUM

FIELD OF THE INVENTION

This invention relates to the printing industry and in particular to digital offset printing and the use of multi-channel imaging units in this field.

BACKGROUND OF THE INVENTION

Multi-channel scanning systems are used to achieve a higher throughput than single channel systems in many different fields of imaging, including the graphic arts. In many multi-channel scanning systems that use continuous scan motion for both axes, a form of distortion known as an orthogonality error is often generated. Orthogonality errors occur during imaging when the planar axes of the original image are distorted in such a way that the planar axes of the generated image are no longer mutually perpendicular. An example of a situation where this can arise is when a continuously moving imaging head writes a helix instead of parallel circles on a cylinder-based imaging system.

The way in which the problem manifests itself is described schematically in FIG. 1 and FIG. 2A. As may be understood from FIG. 1, an orthogonality error is caused in the image due to the helical scan path followed by multi-channel spatial light modulator (SLM) 4 over printing plate 1 attached to cylinder 2. This results from the continuous relative motion of the cylinder 2, driven by motor 3, and leadscrew 6. FIG. 2A depicts the printing plate 1, now removed from the cylinder 2, and shows the orthogonality error that results from this scanning arrangement. The problem becomes more severe the greater the number of channels in multi-channel SLM 4, because of the increased pitch of the path traversed by the written spiral data tracks 5.

One common solution to this problem is to shift or delay the starting point of each swath 8 scanned on plate 1 in order to keep the image orthogonal. This solution is shown schematically in FIG. 2B. This solution causes the final image 9 to be rotated relative to the plate 1. While this approach is acceptable for a small number of parallel channels, it becomes less acceptable as the width of the swath 8, written by multi-channel SLM 4, becomes wider due to the increase in the number of channels in multi-channel SLM 4.

In the standard approach to printing, printing plates are prepared on a separate plate-setter machine and the plates so obtained are then transferred to the actual printer. It is entirely feasible to implement solutions of the nature of that depicted in FIG. 2B on the plate-setter machine. The final printing plate would then be corrected in this process such that the plate put on the actual printing machine would be orthogonal.

With the advent of Digital-Offset-Press (DOP) technology, it has become technologically feasible to image the plates on the printing machine using multi-channel writing techniques as depicted in FIG. 1. However, DOP technology does not provide a natural opportunity to correct the orthogonality as described above. Since the final writing of the plate occurs on the very press itself, the plate needs to be written to be orthogonal.

The speed and efficiency of on-press imaging systems scale directly with the number of channels employed in the scanning head. As a result there is much pressure to create scanning heads with ever larger channel counts. The company CreoScitex of Burnaby, BC, Canada manufactures and uses spatial light modulators with 240 and more channels and implements them in equipment for the printing industry. With reference to FIG. 1, this trend towards ever-larger multi-channel systems implies that the orthogonality problem becomes severely exacerbated. Simultaneously the problem cannot be addressed by the simple skewing method depicted in FIG. 2.B because the image is written after the plate is mounted.

In the particular case where both the front and the back of a printing medium are printed upon, the orthogonality problem described here becomes acute. In such applications, there is a standard practice to align the lines and columns of print on either side of the medium. So, for example, page numbers on one side of a page will coincide with the page numbers on the back of that page. For obvious geometric reasons the skew on the two sides of the medium will be in opposite directions and the orthogonality error causes a misalignment that is twice as large as that evident from FIG. 2A. The reason for this doubling of the error is the use of the second imaging system which, being on the opposite side of the printed material, causes the error to compound in the opposite direction.

A partial solution could be to develop a "mirror image" imaging system, having the orthogonality error compound in an opposite direction. This solution is, however, not practical as the same printing press will use two different imaging systems and the images, while in register, will not in fact be orthogonal. For reasons of economics and maintenance it is desirable to make the imaging units interchangeable.

While orthogonalization has been treated, for example by Moyroud in U.S. Pat. No. 4,819,018 and Nishikawa in U.S. Pat. No. 4,745,487, the unique image orientation and alignment problems encountered in printing simultaneously on both sides of the medium when the scan process introduces a skewing of the image have not been addressed.

The success of Digital-on-Press technology in the commercial mass printing industry is therefore directly linked to correcting the orthogonality problem that is exacerbated by the ever-larger channel-counts in multi-channel systems that characterize this technology.

BRIEF SUMMARY OF THE INVENTION

The main object of the present invention is to improve registration of images in a double-sided printing arrangement by correcting the orthogonality of images printed on either side of the printed sheets. A second object is to achieve this orthogonality correction using purely electronic means.

The present invention is a method to generate alignable orthogonal images from nonorthogonal scans in a double-sided digital-offset-press arrangement by shifting the image data in the multi-channel modulators in a direction and rate that keeps the images orthogonal. The image data is shifted parallel to the cylinder axes and the amount of shift per cylinder rotation equals the distance the multi-channel modulators move relative to their respective cylinders per rotation of the relevant cylinder. This prevents "parallelogram" type distortion in the images and maintains the orthogonality of the original images, thereby allowing the images on the back and front of the printing medium to be aligned. The shift can be done continuously or in discrete steps. The invention is also extendable to two-dimensional modulators such as deformable mirror devices (DMD) and liquid crystal light valves (LCLV).

BRIEF DESCRIPTION OF THE DRAWINGS

FIG. 2A is a schematic representation of the appearance of the image if orthogonality correction is not used.

FIG. 2B is a schematic representation of a typical prior art orthogonality correction.

DETAILED DESCRIPTION OF THE PREFERRED EMBODIMENT

Figure 1:
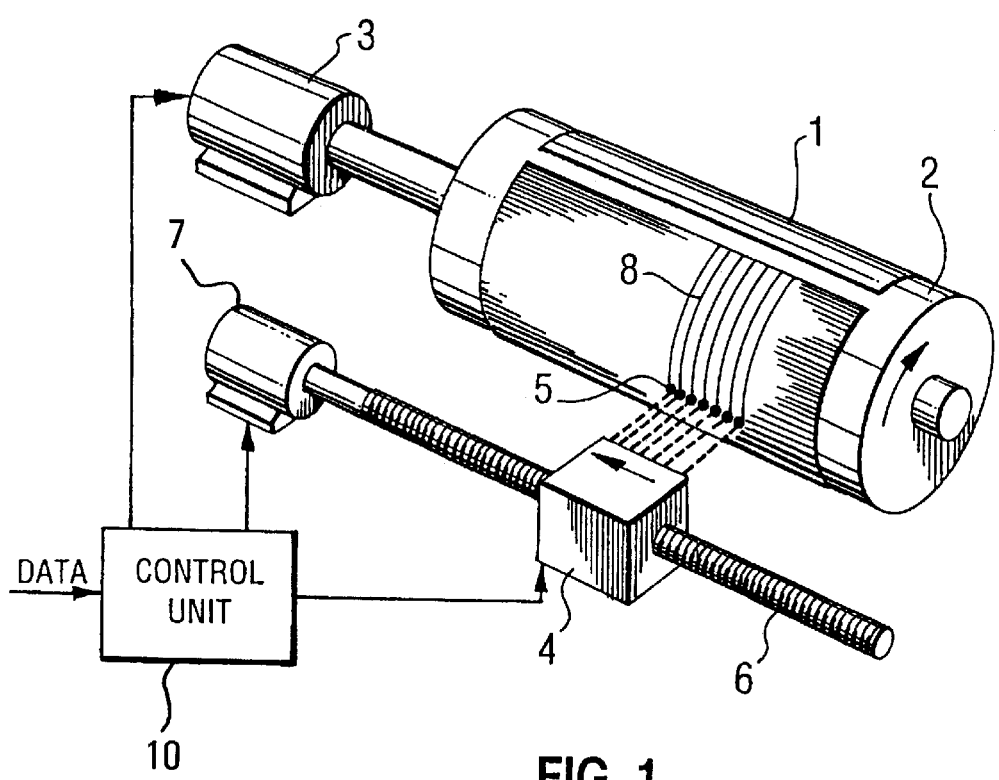
FIG. 1 is an isometric view of a typical multi-channel scanning system of the type which can benefit from the current invention.

A generic two-dimensional multi-channel scanning system is shown in FIG. 1. A sheet of radiation-sensitive material 1 is wrapped around cylinder 2 and rotated by motor 3. Scanning of the image onto the radiation-sensitive material 1 is done by a multi-channel modulator 4 traversed along cylinder 2 using a leadscrew 6 driven by motor 7. Modulator 4 generates a bit pattern 5 on sheet 1. These bits form a group of parallel tracks (also known as a "swath") 8. Motor 3, motor 7 and the incoming data are synchronized by control unit 10. The sheet of radiation-sensitive material may be any radiation-sensitive material and specifically includes optical and thermal printing plates. The sheet of radiation-sensitive material 1 may be a fitted printing plate to be exposed. The sheet of radiation-sensitive material may also be a fitted printing sleeve and, alternatively, it may be a light or thermally sensitive coating that is applied to the cylinder. Most particularly, such coatings include imageable polymer layers applied to the plate-carrying cylinder by various means, without having to change plates. Such technologies are also known as "Plateless Printing" or "Spray-on Polymer" processes.

No further details about scanning systems are needed to understand the current invention. Multi-channel modulators are well known in the art and variously employ acousto-optic modulators (for example U.S. Pat. No. 4,577,932), laser diode arrays (for example U.S. Pat. No. 4,743,091), deformable mirror devices (for example U.S. Pat. No. 4,441,791), or optical fibers (for example U.S. Pat. No. 4,801,950).

Since motor 3 and motor 7 are rotating continuously, swath 8 is written in the form of a helix and is not parallel to the edge of sheet 1. A more serious problem is the loss of orthogonality in the image. Referring now to FIG. 2, image 9 in FIG. 2a is distorted into a parallelogram and is no longer orthogonal.

Orthogonalization of the image corrects for such distortions. The term orthogonalization should be understood to describe a process that ensures that a scanned image is corrected for any loss of mutual perpendicularity of its two planar axes that occurs during scanning. Hence, a square image that is distorted to a parallelogram shape, will be said to have been orthogonalized if it is returned to its square proportions.

Figure 3:
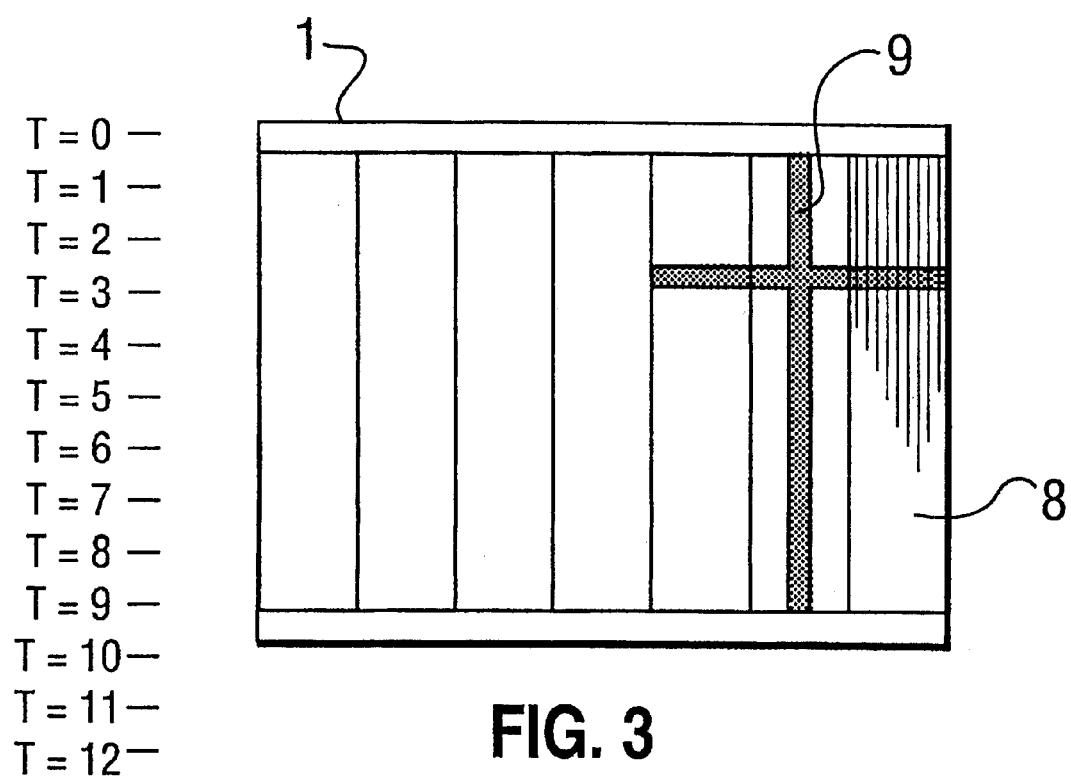
FIG. 3 is a schematic representation of an image using an orthogonality correction according to the current invention

According to the present invention, the data pattern is shifted in the multi-channel modulator in a direction and rate that keeps the image orthogonal. Referring now to FIG. 3 in conjunction with FIG. 1; if the width of swath 8 consists of n bits, each corresponding to one SLM channel, the modulator 4 is going to travel the width of n bits during one rotation of the cylinder. If the data is shifted, one bit at a time, n bits towards the beginning of the plot during one rotation of cylinder 2, the resultant image will be orthogonal, as shown in FIG. 3.

Figure 4:
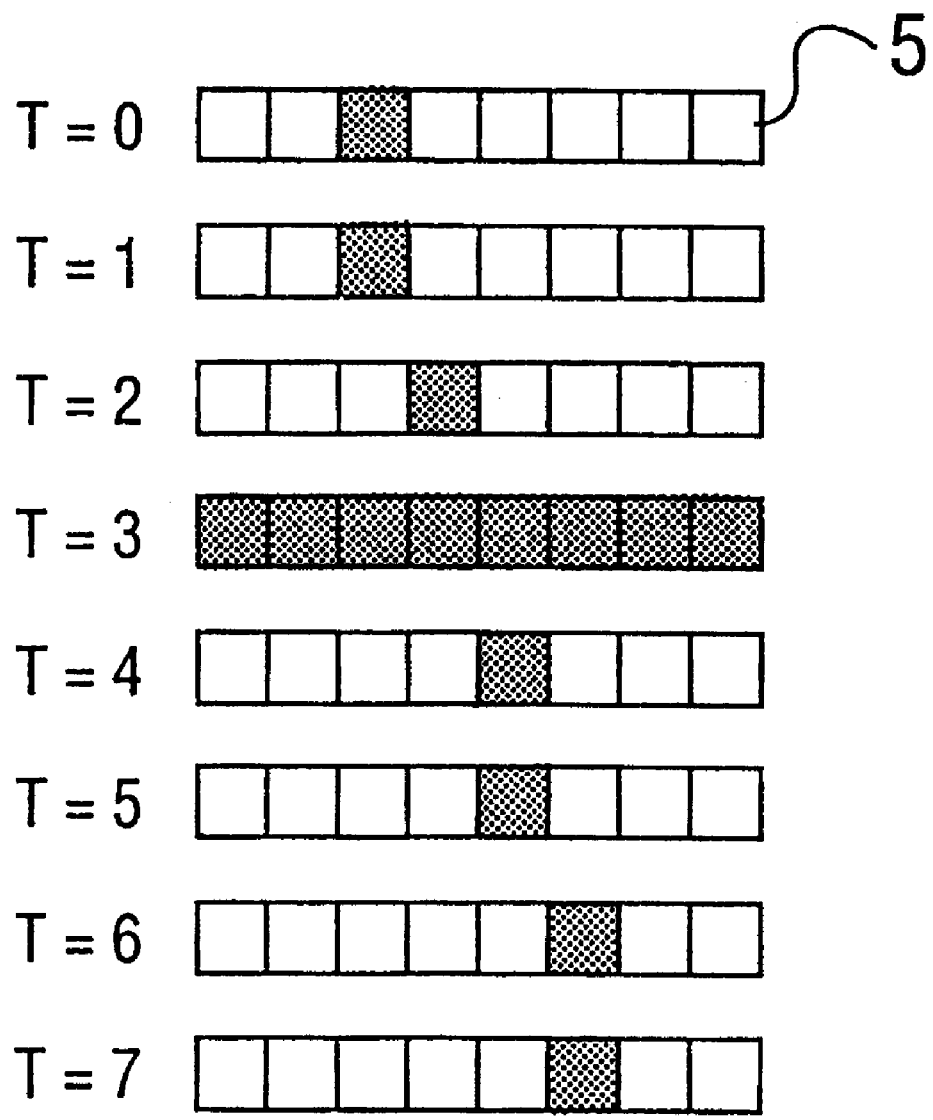
FIG. 4 is a schematic representation of the data in a multi-channel exposure head during consecutive periods.

FIG. 4 shows the shifting of the bit pattern 5. The time-intervals (t=0, t=1, etc.) correspond to the times it takes the cylinder to move the equivalent of one bit. In this example, the bit shift is quantized to one bit steps. It is obvious that a continuous movement can also be used in the same manner. A continuous shift can be achieved, by the way of example, by using an acousto-optic deflector or a moving mirror in order to shift the bit pattern by the width of n bits for each cylinder rotation.

An alternative shift mechanism consists of assigning a number of SLM channels to a single bit. By switching the SLM channels at either end of the bit on or off, the position of the bit may be moved in substantially continuous fashion in a pre-determined direction whilst maintaining a fixed number of SLM channels in the "on" state to maintain the definition of the beam. The degree of continuity of motion is determined by the number of SLM channels per bit; the larger this number, the more continuous the motion.

Figure 5:
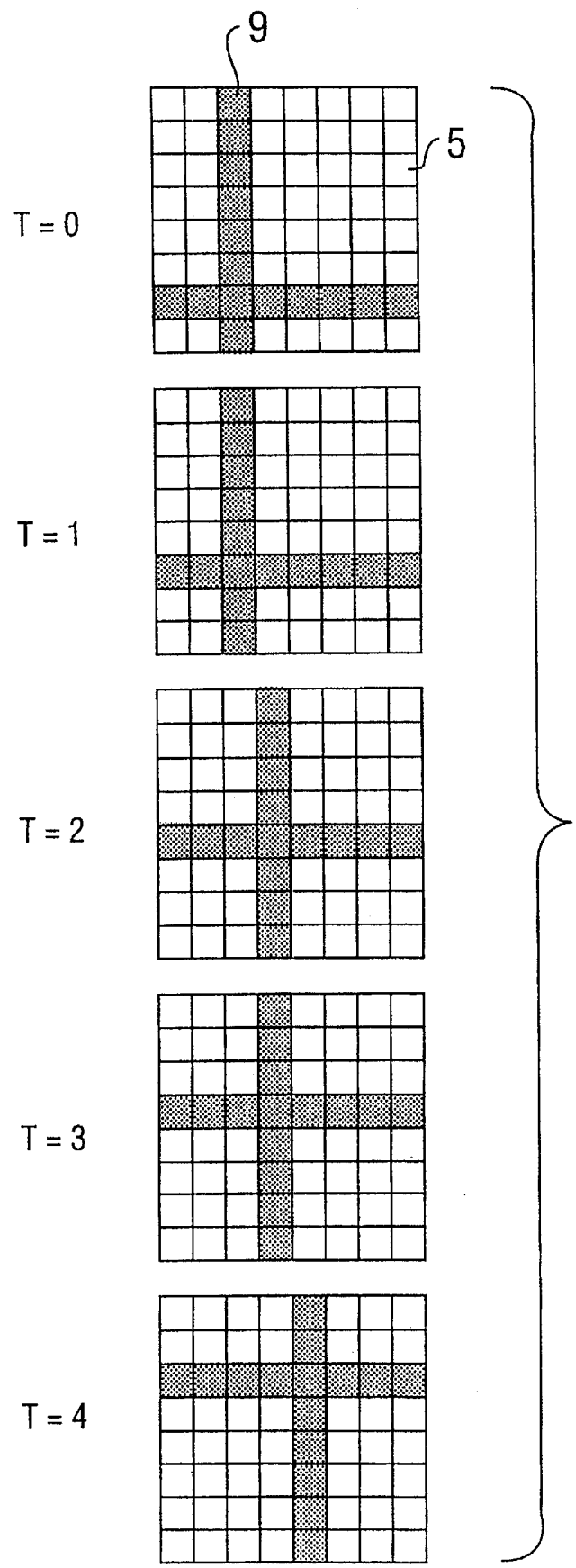
FIG. 5 is a schematic representation of the data in a two-dimensional multi-channel modulator during consecutive periods.

The invention can also be applied to two-dimensional light modulators, as shown schematically in FIG. 5. In this case, the bit pattern 5 formed on the surface of the cylinder is two-dimensional. The image 9 is shifted vertically at a rate keeping it stationary relative to the radiation-sensitive material. This mode of exposure increases the amount of exposure each part of image 9 receives since each location is exposed multiple times without blurring the image. This mode of exposure is detailed in U.S. Pat. No. 5,049,901, and 5,132,723, and need not be detailed here. At the same time, the image 9 is also shifted from left to right in order to cancel the helical motion of the bit pattern 5 relative to the cylinder. The left-to-right motion is done one bit at a time in order to generate a smooth image without any discontinuities due to bit shifts.

Figure 6:
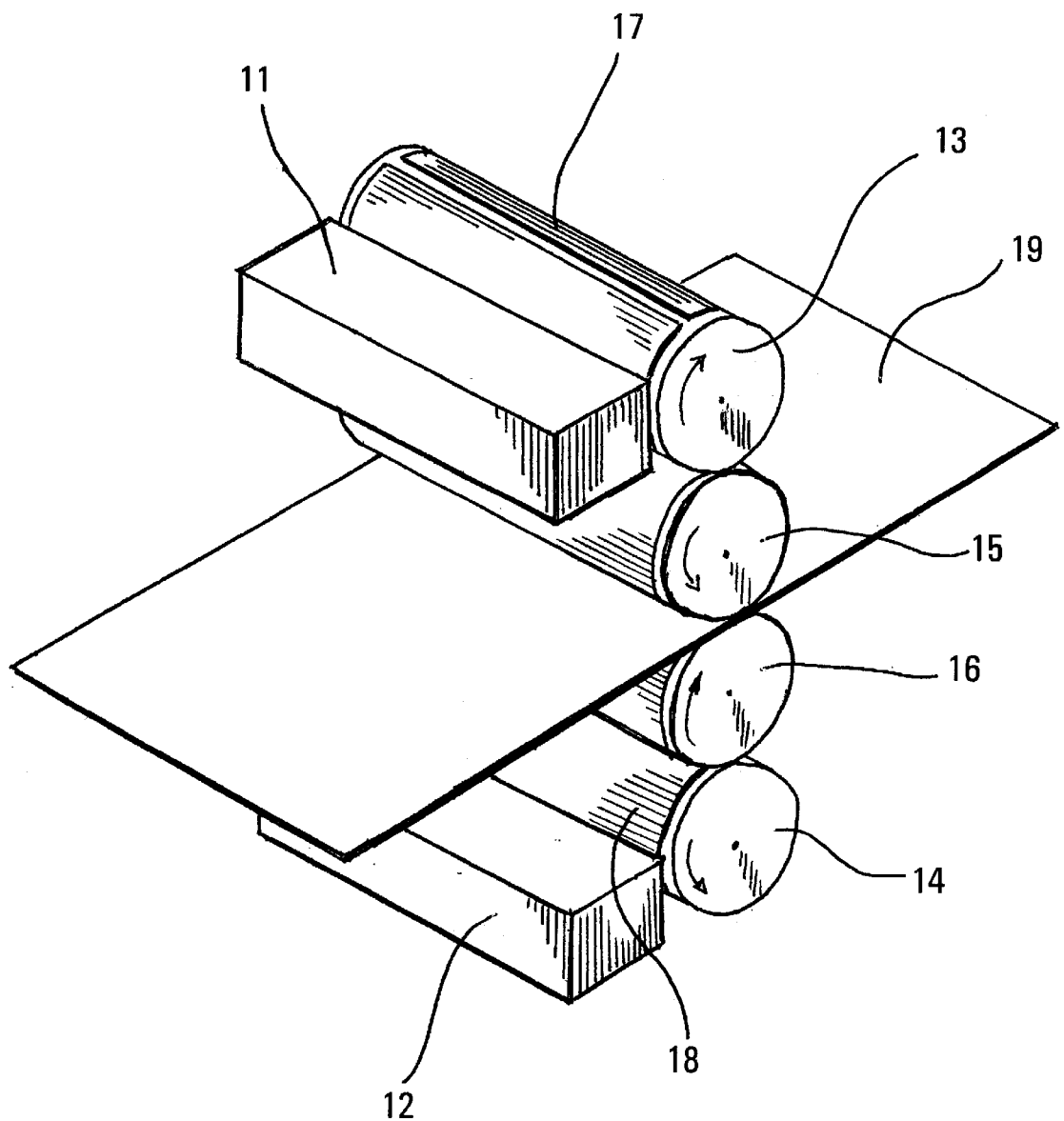
FIG. 6 depicts the double-sided digital-offset-press arrangement addressed by the invention.

FIG. 6 depicts a generic double-sided digital-offset-press arrangement in which two sides of printing medium 19 are printed simultaneously. Scanning heads 11 and 12 each separately comprise a multi-channel modulator 4 as per FIG. 1. Each of scanning heads 11 and 12 writes onto sheets of radiation-sensitive material 17 and 18, respectively, on cylinders 13 and 14, respectively, data as described. herein. Again, the sheets of radiation-sensitive material 17 and 18 may be fitted printing plates to be exposed. They may also be fitted printing sleeves, or alternatively, they may be light or thermally sensitive coatings that are applied to the cylinders 13 and 14. Most particularly, it includes "spray-on-press" imageable polymer layers.

As is the practice with offset press technology, the printing surfaces so created are inked by an inking system (not shown) and the image is printed on both sides of the printing medium 19 simultaneously by means of ink-transfer via blanket rollers 15 and 16. The mechanisms to ensure that the two sides of printing medium 19 are printed in register are well established in the industry and will not be dwelt upon here. However, in order to achieve true front-to-back registration, the images have to be aligned (both in the X and Y directions), scaled for best mutual fit, rotated to be parallel, and orthogonalized (that is, have no parallelogram-distortion). The fully orthogonalized images produced by the current invention allow the press to produce printed images on the two sides of the medium that are fully alignable without distortion or rotation.

Typical alignment methods have been described by Kline in U.S. pat. No. 5,174,205 and Pensavecchia in U.S. pat. No.

5,163,436 and will not be further discussed here. However, images can never be fully in register as long as they are written with an orthogonality error.

The term multi-channel exposure unit should be understood to describe any unit that employs a multiplicity of channels of light to image a medium on a surface. Examples of such units are multi-channel spatial light modulators in general, multi-channel acousto-optic modulators, laser diode arrays, monolithic laser diode arrays, one-and-two-dimensional deformable mirror devices, silicon micro-machined or micro-mechanical devices and liquid crystal light valves.

The term "image data patterns" should be understood to describe the 2-dimensional set of pixel data representing the scanned image information.

What is claimed is:

1. A method for the mutual registration of images on opposing sides of a printing medium printed on a double-sided printing press, said method comprising the orthogonalization of said images wherein said orthogonalization of said images on both of said opposing sides of said printing medium comprises:

scanning said images with multi-channel exposure units in the first of two dimensions, continuously advancing said multi-channel exposure units in the second of said two dimensions and gradually shifting image data patterns across the channels of said multi-channel exposure units in a direction opposite to said advancement of said exposure units and at a rate that maintains the orthogonality of said images.

2. A method as in claim 1 wherein scanning said images comprises scanning said images onto printing plates.

3. A method as in claim 1 wherein said multi-channel exposure units are mutually interchangeable.

4. A method as in claim 1 wherein scanning said images comprises scanning said images onto printing sleeves.

5. A method as in claim 1 wherein said double-sided printing press comprises cylinders said multi-channel exposure units image imageable coatings on the surfaces of said cylinders of said printing press.

6. A method as in claim 5 wherein said imageable coatings are sprayed onto said cylinders.

7. A method for the mutual registration of a first image to be printed with a double-sided printing press on a first side of a printing medium with a second image to be printed on a second side of the printing medium, the method comprising:

advancing a radiation-sensitive material relative to a multi-channel exposure unit in a first direction;

advancing the multi-channel exposure unit relative to the radiation-sensitive material at a first rate in a second direction substantially perpendicular to the first direction; and shifting data representing the first image in a third direction substantially opposite to the second direction and at a second rate sufficient to provide mutual registration of the first and second images on the printing medium when the radiation sensitive material is used to print the first image.

8. A method as in claim 7 wherein the radiation-sensitive material is a material selected from the group consisting of a printing plate, a printing sleeve, a light sensitive coating, and a thermally sensitive coating.

9. A method as in claim 8 wherein the exposure unit comprises a multi-channel light modulator.

10. A method as in claim 7 wherein the exposure unit comprises a multi-channel light modulator.

* * * * *